US012787484B2

(12) United States Patent
Chen et al.

(10) Patent No.: US 12,787,484 B2
(45) Date of Patent: Nov. 3, 2026

(54) BACK CONTACT SOLAR CELL AND PHOTOVOLTAIC MODULE

(71) Applicants: JINKO SOLAR CO., LTD., Jiangxi (CN); JINKO SOLAR (HAINING) CO., LTD., Haining (CN)

(72) Inventors: Yubin Chen, Shangrao (CN); Danwei Xia, Shangrao (CN); Zhipeng Xia, Shangrao (CN); Jide Huang, Shangrao (CN); Changming Liu, Shangrao (CN)

(73) Assignees: JINKO SOLAR CO., LTD., Jiangxi (CN); JINKO SOLAR (HAINING) CO., LTD., Haining (CN)

( * ) Notice: Subject to any disclaimer, the term of this patent is extended or adjusted under 35 U.S.C. 154(b) by 0 days.

(21) Appl. No.: 19/082,450

(22) Filed: Mar. 18, 2025

(65) Prior Publication Data

US 2026/0136705 A1 May 14, 2026

(30) Foreign Application Priority Data

Nov. 11, 2024 (CN) ......................... 202411604081.6

(51) Int. Cl.
*H10F 77/30* (2025.01)
*H10F 10/14* (2025.01)
(Continued)

(52) U.S. Cl.
CPC ........... *H10F 77/311* (2025.01); *H10F 10/14* (2025.01); *H10F 77/219* (2025.01); *H10F 77/50* (2025.01)

(58) Field of Classification Search
CPC ...... H10F 77/311; H10F 10/14; H10F 77/219; H10F 77/50; H10F 10/146; H10F 77/315; H10F 19/804; H10F 77/215
See application file for complete search history.

(56) References Cited

U.S. PATENT DOCUMENTS

2009/0258485 A1 10/2009 Liu et al.
2018/0006170 A1* 1/2018 Hsia ...................... H10F 10/146
(Continued)

FOREIGN PATENT DOCUMENTS

CN 105870249 A 8/2016
CN 110112230 A 8/2019
(Continued)

OTHER PUBLICATIONS

Extended European Search Report for European Application No. 25163930.8 mailed Aug. 27, 2025.
(Continued)

*Primary Examiner* — Michael Y Sun
(74) *Attorney, Agent, or Firm* — Ballard Spahr LLP

(57) ABSTRACT

The present disclosure relates to a back contact solar cell and a photovoltaic module. The back contact solar cell includes a silicon substrate, a first passivation layer, a protective layer, a first electrode, and a second electrode. The silicon substrate has a first surface and a second surface opposite to each other. A P-type conductive section and an N-type conductive section spaced apart from each other are provided at a side of the second surface of the silicon substrate. The first passivation layer is disposed on the first surface of the silicon substrate. The protective layer is disposed on a side of the first passivation layer facing away from the silicon substrate. The first electrode is electrically connected to the P-type conductive section. The second electrode is electrically connected to the N-type conductive section.

19 Claims, 7 Drawing Sheets

(51) Int. Cl.
*H10F 77/20* (2025.01)
*H10F 77/50* (2025.01)

(56) References Cited

U.S. PATENT DOCUMENTS

| | | | | |
|---|---|---|---|---|
| 2019/0386158 | A1* | 12/2019 | Qiu | H10F 10/165 |
| 2022/0393052 | A1* | 12/2022 | Qiu | H10F 19/908 |
| 2023/0369522 | A1* | 11/2023 | Li | B32B 3/26 |

FOREIGN PATENT DOCUMENTS

| | | | | |
|---|---|---|---|---|
| CN | 110896107 | A | | 3/2020 |
| CN | 218160393 | U | | 12/2022 |
| CN | 218827167 | U | * | 4/2023 |
| CN | 220585238 | U | | 3/2024 |
| CN | 118039714 | A | | 5/2024 |
| CN | 118263345 | A | | 6/2024 |
| CN | 118748213 | A | | 10/2024 |
| CN | 118899350 | A | | 11/2024 |
| EP | 4456152 | A1 | | 10/2024 |
| JP | H05335606 | A | | 12/1993 |
| JP | 2013161980 | A | | 8/2013 |
| JP | 2020129689 | A | | 8/2020 |
| JP | 2023534501 | A | | 8/2023 |

OTHER PUBLICATIONS

Extended European Search Report for European Application No. 26199508.8 mailed Sep. 3, 2026.

* cited by examiner

BACK CONTACT SOLAR CELL AND PHOTOVOLTAIC MODULE

CROSS-REFERENCE TO RELATED APPLICATIONS

This application claims priority of Chinese Patent Application No. 202411604081.6, filed on Nov. 11, 2024, and entitled "BACK CONTACT SOLAR CELL AND PHOTOVOLTAIC MODULE", the content of which is incorporated herein by reference in its entity.

TECHNICAL FIELD

The present disclosure relates to the technical field of photovoltaic cells, and in particular to a back contact solar cell and a photovoltaic module.

BACKGROUND

A solar cell, also known as a "solar chip" or "photovoltaic cell," is a photoelectric semiconductor device that utilizes sunlight to generate electricity directly. The solar cell can instantly output voltage and generate current in the case of a loop, as long as it is exposed to light that meets certain illuminance conditions.

An interdigitated back contact (IBC) solar cell has no metal grid lines on its front surface, with positive and negative metal electrodes disposed in an interdigitated pattern on its back surface. The IBC solar cell exhibits a good photoelectric conversion efficiency due to the absence of obstruction from the grid lines on its front surface. However, during the process of printing the metal grid lines on the cell wafers and conveying the cell wafers to an assembling process, the front films of the cell wafers are prone to damage. Currently, an isolation paper is commonly interposed between two adjacent cell wafers. However, in the sorting and collecting process, the risk of scratching the front films of the cell wafers is still increased due to uneven collection of the cell wafers or misalignment of the isolation paper.

SUMMARY

In a first aspect, the present disclosure provides a back contact solar cell, including a silicon substrate, a first passivation layer, a protective layer, a first electrode, and a second electrode. The silicon substrate has a first surface and a second surface opposite to each other. A P-type conductive section and an N-type conductive section spaced apart from each other are provided at a side of the second surface of the silicon substrate. The first passivation layer is disposed on the first surface of the silicon substrate. The protective layer is disposed on a side of the first passivation layer facing away from the silicon substrate. The first electrode is electrically connected to the P-type conductive section. The second electrode is electrically connected to the N-type conductive section.

In an embodiment, in a thickness direction of the back contact solar cell, a projected area of the protective layer is 2% to 3% of a projected area of the silicon substrate.

In an embodiment, the protective layer has a thickness of $H_1$, where 5 $\mu m \leq H_1 \leq 60$ $\mu m$.

In an embodiment, the protective layer includes a plurality of support members spaced apart from each other and disposed on the side of the first passivation layer facing away from the silicon substrate.

In an embodiment, a distance between geometric centers of any two adjacent support members is d, where $0<d\leq 20$ mm.

In an embodiment, a cross-sectional shape of the support members, perpendicular to a thickness direction of the back contact solar cell, is a circular shape, a semicircular shape, an annular shape, a rectangular shape, a triangular shape, a rhombic shape, a W shape, a V shape, or any combination thereof.

In an embodiment, a cross-sectional shape of the support member, perpendicular to the thickness direction of the back contact solar cell, is a circular shape with a radius of $R_1$, where $0<R_1\leq 4$ mm.

In an embodiment, a cross-sectional shape of the support member, perpendicular to the thickness direction of the back contact solar cell, is a strip shape formed by combing a semicircular shape and a rectangular shape. The semicircular shape has a radius of $R_2$, where $0<R_2\leq 2$ mm. The rectangular shape has a length of L, where $1\leq L/R_2\leq 5$.

In an embodiment, the protective layer is a transparent protective layer.

In an embodiment, a material of the protective layer is acrylic resin, epoxy resin, polyurethane, silicone, or any combination thereof.

In a second aspect, the present disclosure provides a photovoltaic module. The photovoltaic module includes a cell string, an encapsulation layer, and a cover plate. The cell string is formed by a plurality of back contact solar cells that are provided according to any one of the above embodiments and connected to each other. The encapsulation layer is configured to cover a surface of the protective layer of each of the plurality of back contact solar cells of the cell string. The cover plate is configured to cover a surface of the encapsulation layer that is away from the cell string.

It should be understood that the above general description and the following specific description are only exemplary and are not intended to limit the present disclosure.

BRIEF DESCRIPTION OF THE DRAWINGS

In order to describe technical solutions in embodiments of the present disclosure more clearly, accompanying drawings required to be used in the embodiments will be briefly introduced below, it is apparent that the accompanying drawings described below are only some embodiments of the present disclosure, and those of ordinary skill in the art may also obtain other accompanying drawings according to these accompanying drawings without creative work.

REFERENCE NUMERALS

Figure 1:
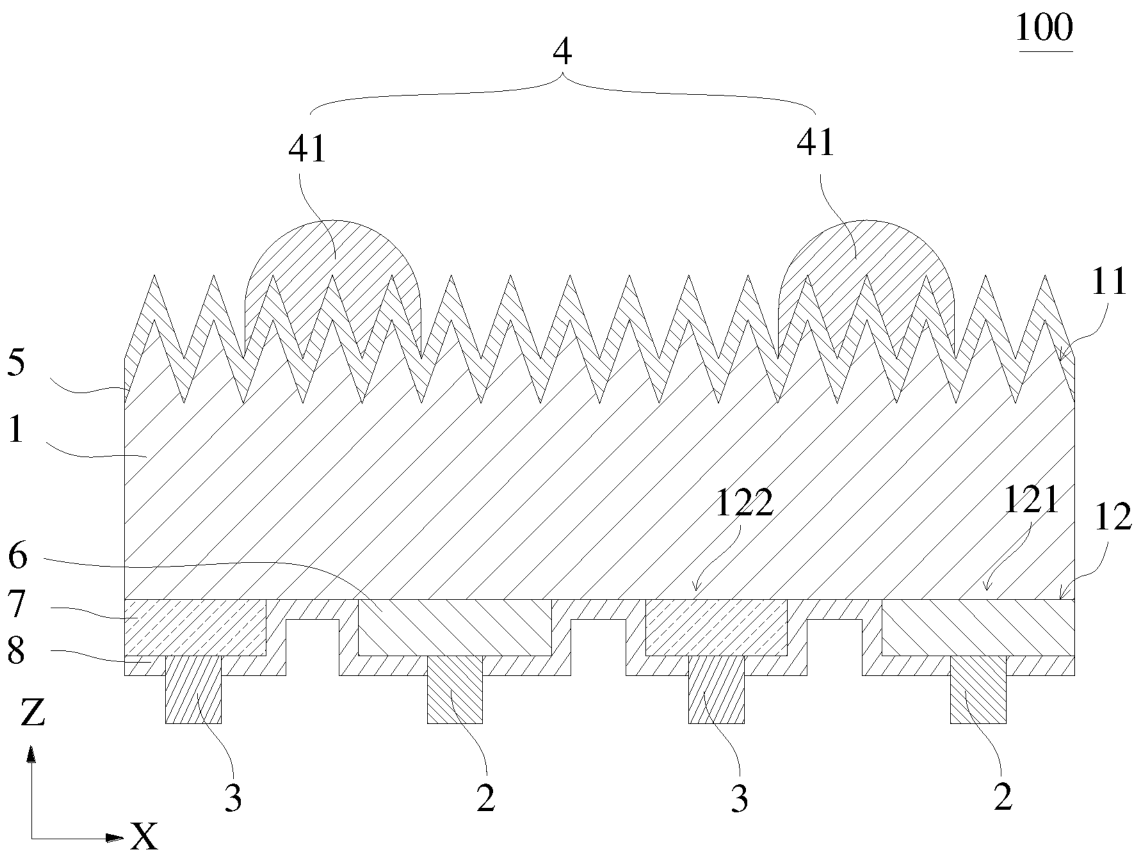
FIG. 1 is a schematic cross-sectional view of a back contact solar cell in a specific embodiment of the present disclosure.

100—back contact solar cell;
1—silicon substrate;
11—first surface;
12—second surface;
121—P-type conductive section;
122—N-type conductive section;
2—first electrode;
3—second electrode;
4—protective layer,
41—support member,
5—first passivation layer,
6—first doped conductive layer;
7—second doped conductive layer;
8—second passivation layer;
9—anti-reflection layer;
10*a*—first tunneling dielectric layer;
10*b*—second tunneling dielectric layer;
110—cell string;
120—encapsulation layer;
130—cover plate;
X—first direction
Y—second direction; and
Z—thickness direction.

The accompanying drawings herein are incorporated into the specification to form a part of the specification, illustrate embodiments conforming to the present disclosure, and are used to explain the principle of the present disclosure together with the specification.

DETAILED DESCRIPTION

To better understand the technical solution of the present disclosure, the following provides a detailed description of the embodiments of the present disclosure with reference to the accompanying drawings.

In the description of the present disclosure, unless otherwise expressly specified and defined, the terms "first" and "second" are only used for descriptive purposes, and cannot be understood as indicating or implying relative importance. Unless otherwise specified or stated, the term "a plurality of" refers to two or more. The terms such as "connected" and "fixed" should be understood broadly. For example, "connected" may be fixedly connected, or may be detachably connected, or integrally connected, or electrically connected; or, "connected" may be directly connected or indirectly connected through an intermediate medium. Those of ordinary skill in the art should understand specific meanings of the above terms in the present disclosure according to specific situations.

The terms used in the embodiments of the present disclosure are merely used for describing the specific embodiments rather than limiting the present disclosure. Singular forms including "a", "an", and "the" used in the embodiments and claims of the present disclosure are also intended to include a plural form, except that the context clearly expresses other meanings.

It should be understood that the term "and/or" used herein is merely a description of an association relationship between associated objects, indicating that there may be three relationships. For example, A and/or B may represent: A exists alone, A and B exist together, or B exists alone. In addition, the character "/" herein generally means that the associated objects before and after it are in an "or" relationship.

It should be noted that the directional terms such as "up", "down", "left", and "right" described in the embodiments of the present disclosure are described based on the angle shown in the accompanying drawings and should not be construed as limiting the embodiments of the present disclosure. In addition, in the context, it should also be understood that when it is mentioned that one element is connected "on" or "below" the other element, it may be directly connected "on" or "below" the other element, or it may be indirectly connected "on" or "below" the other element through an intermediate element.

An interdigitated back contact (IBC) solar cell has no metal grid lines on its front surface, with positive and negative metal electrodes disposed in an interdigitated pattern on its back surface. The IBC solar cell exhibits a good photoelectric conversion efficiency due to the absence of obstruction from the grid lines on its front surface. However, during the process of printing the metal grid lines on the cell wafers and conveying the cell wafers to an assembling process, the cell waters are stacked with each other, and the front films of the cell wafers are prone to damage. Currently, a spacer paper is commonly interposed between two adjacent cell wafers. However, in the sorting and collecting process, the risk of scratching the front films of the cell wafers is still increased due to uneven collection of the cell wafers or misalignment of the spacer paper.

In view of this, the present disclosure provides a back contact solar cell and a photovoltaic module. The back contact solar cell includes, but is not limited to, an interdigitated back contact (IBC) solar cell, a hybrid passivated back contact (HPBC) solar cell, a tunneling oxide passivated contact back contact (TBC) solar cell, a heterojunction back contact (HBC) solar cell, etc., which is not limited herein.

The present disclosure is further described in detail through specific embodiments with reference to the accompanying drawings.

As shown in FIG. 1, the back contact solar cell 100 has a length direction, a width direction, and a thickness direction Z. For ease of understanding, the width direction of the back contact solar cell 100 is defined as a first direction X, and the length direction of the back contact solar cell 100 is defined as a second direction Y.

As shown in FIG. 1, the back contact solar cell 100 includes a silicon substrate 1, a first passivation layer 5, a protective layer 4, a first electrode 2, and a second electrode 3. The silicon substrate 1 has a first surface 11 and a second surface 12 that are opposite to each other. The first passivation layer 5 is disposed on the first surface 11 of the silicon substrate 1. The protective layer 4 is disposed on a side of the first passivation layer 5 facing away from the silicon substrate 1. A P-type conductive section 121 and an N-type conductive section 122 that are spaced apart from each other are provided at a side of the second surface 12 of the silicon substrate 1. The first electrode 2 is electrically connected to the P-type conductive section 121. The second electrode 3 is electrically connected to the N-type conductive section 122.

The silicon substrate 1 is configured to receive incident light and generate photogenerated carriers. The first surface 11 of the silicon substrate 1 serves as a light-receiving surface, namely, a surface exposed to sunlight irradiation. The second surface 12 of the silicon substrate 1 is a surface of the silicon substrate 1 that is opposite to the first surface 11. In some embodiments, the silicon substrate 1 is a silicon-based substrate, which may include monocrystalline silicon, polycrystalline silicon, amorphous silicon, microcrystalline silicon, or any combination thereof. In some other embodiments, a material of the silicon substrate 1 may also be silicon carbide, an organic material, or a multicomponent compound. The multicomponent compound may include, but is not limited to, perovskite, gallium arsenide, cadmium telluride, copper indium selenide, and the like. Exemplarily, the silicon substrate 1 in the present disclosure may be a monocrystalline silicon substrate. The silicon substrate 1 may contain a doping element therein. The doping element may have a conductivity type that is either N-type or P-type. An N-type element may be a group V element such as phosphorus (P) element, bismuth (Bi) element, antimony (Sb) element, or arsenic (As) element. A P-type element may be a group III element such as boron (B) element, aluminum (Al) element, gallium (Ga) element, or indium (In) element. For example, when the silicon substrate 1 is a P-type silicon substrate, the doping element in the silicon substrate 1 is of P type. For another example, when the silicon substrate 1 is an N-type silicon substrate, the doping element in the silicon substrate 1 is of N type. As an example in the present disclosure, the silicon substrate 1 is exemplified as an N-type silicon substrate, which can improve the photoelectric conversion efficiency of the back contact solar cell 100 and reduce the manufacturing cost.

The first electrode 2 and the second electrode 3 are configured to collect and aggregate the current in the back contact solar cell 100. Exemplarily, the first electrode 2 and the second electrode 3 may be manufactured using screen printing and sintering methods. In some embodiments, the first electrode 2 and the second electrode 3 may be manufactured from a metal paste of aluminum, silver, gold, nickel, molybdenum, copper, or any combination thereof, which is not limited herein.

The first passivation layer 5 can effectively passivate the first surface 11 of the silicon substrate 1, thereby reducing the interface state density, decreasing the recombination of minority carriers, improving the carrier transport efficiency at the interface, and enhancing the photoelectric conversion efficiency of the back contact solar cell 100. Exemplarily, the first passivation layer 5 may be deposited using a plasma-enhanced chemical vapor deposition method. It should be understood that the first passivation layer 5 may be formed using other methods, such as an organic chemical vapor deposition method. The first passivation layer 5 may be of a single-layer structure or a laminated structure, with a thickness of each layer designed respectively. Specifically, the first passivation layer 5 may be any one of or a combination of any two or more of a silicon nitride layer, a silicon oxynitride layer, a silicon oxide layer, and an aluminum oxide layer. It should be understood that the first passivation layer 5 may also be another type of passivation layer, which is not limited herein.

In the present disclosure, as shown in FIG. 1, the protective layer 4 is disposed on a side of the first passivation layer 5 facing away from the first surface 11 of the silicon substrate 1. The protective layer 4 can prevent the contact between a surface of the first passivation layer 5 and other stacked back contact solar cells 100 or other objects, so that during the sorting and collecting process or the assembling process of the photovoltaic module after the first electrode 2 and the second electrode 3 of the back contact solar cell 100 are printed, the protective layer 4 can protect the first passivation layer 5 from being scratched or damaged by other objects, thereby ensuring the passivation effect of the first passivation layer 5 on the first surface 11 and improving the photoelectric conversion efficiency of the back contact solar cell 100.

Additionally, since the protective layer 4 is directly disposed on the side of the first passivation layer 5 facing away from the silicon substrate 1 and cannot move relative to the surface of the first passivation layer 5, the protective layer 4 can still well protect the surface of the first passivation layer 5 even when multiple back contact solar cells 100 are stacked unevenly, without the need to additionally add an isolation component between every two adjacent back contact solar cells 100 during the sorting and collecting process, which can improve the sorting and collecting efficiency of the multiple back contact solar cells 100. In addition, the back contact solar cell 100 is simple in structure, easy to manufacture, and low in manufacturing cost.

Figure 2:
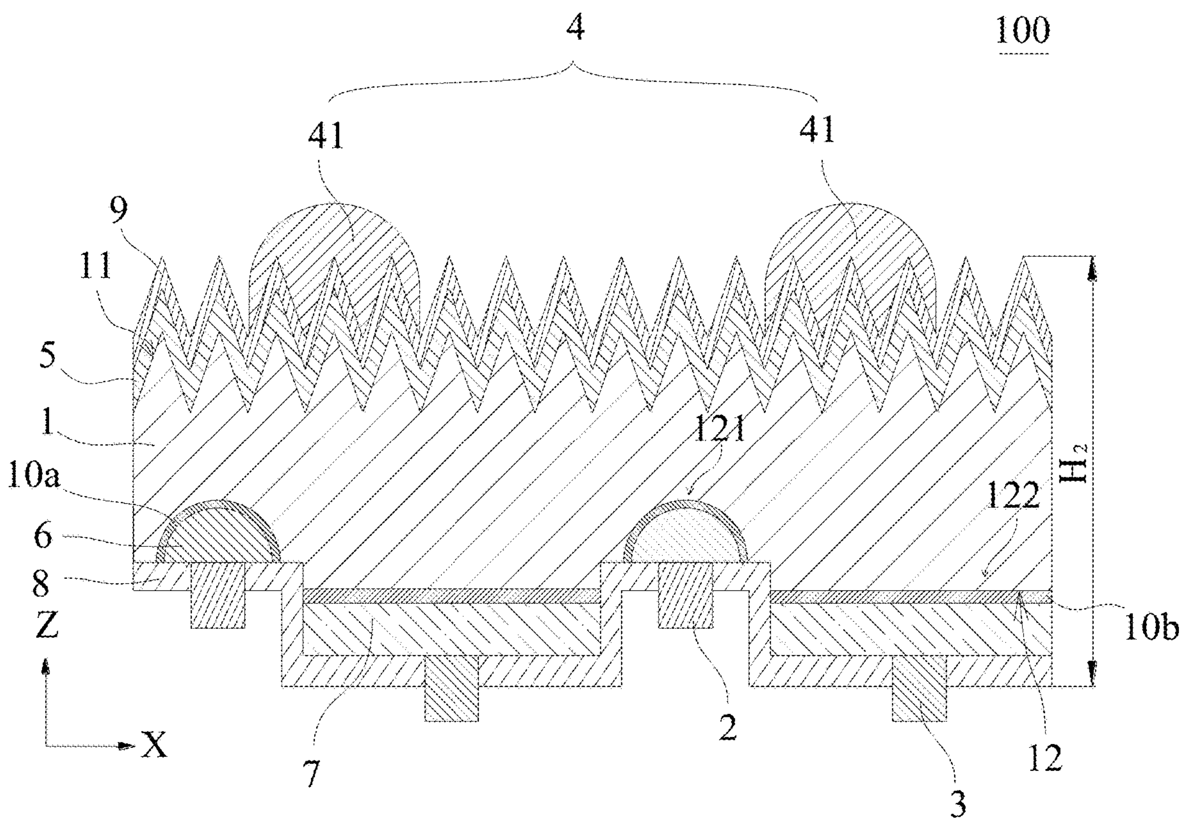
FIG. 2 is a schematic cross-sectional view of a back contact solar cell in another specific embodiment of the present disclosure.

As shown in FIG. 1 and FIG. 2, the back contact solar cell 100 further includes a first doped conductive layer 6, a second doped conductive layer 7, and a second passivation layer 8.

The first doped conductive layer 6 is disposed in the P-type conductive section 121 at the second surface 12 of the silicon substrate 1. The first doped conductive layer 2 may serve as an emitter. The doping element in the first doped conductive layer 2 may be in a different conductivity type from the doping element in the silicon substrate 1. The first doped conductive layer 2 and the silicon substrate 1 may collectively form a PN junction structure. Exemplarily, when the silicon substrate 1 is the N-type silicon substrate, a portion of the silicon substrate 1 at the P-type conductive section 121 may be subjected to boron diffusion to form the first doped conductive layer 6 in P-type.

The second doped conductive layer 7 is disposed in the N-type conductive section 122 at the second surface 12 of the silicon substrate 1. The doping element in the second doped conductive layer 7 is the same as that in the silicon substrate 1, with a concentration gradient formed between the second doped conductive layer 7 and the silicon substrate 1, so that the second doped conductive layer 7 can form a good contact with the second electrode 3 and an energy band bending can be formed at the surface of the N-type conductive section 122, thereby achieving the selective transport of carriers and reducing the recombination losses. The second doped conductive layer 7 may be deposited in the N-type conductive section 122 using any one of a physical vapor deposition method, a chemical vapor deposition method, a plasma-enhanced chemical vapor deposition method, and an atomic layer deposition method.

The second passivation layer 8 is disposed on a side of the first doped conductive layer 6 and a side of the second doped conductive layer 7 that face away from the silicon substrate 1 and disposed on at least a portion of the second surface 12. The second passivation layer 8 can effectively passivate the sides of the first doped conductive layer 6 and the second doped conductive layer 7 facing away from the silicon substrate 1 and the at least a portion of the second surface 12. Exemplarily, the second passivation layer 8 may be deposited using the plasma-enhanced chemical vapor deposition method. It should be understood that the second passivation layer 8 may be deposited using other methods, such as the organic chemical vapor deposition method. The second passivation layer 8 may be of a single-layer structure or a laminated structure, with a thickness of each layer designed respectively. Specifically, the second passivation layer 8 may be any one of or a combination of two or more of a silicon nitride layer, a silicon oxynitride layer, a silicon oxide layer, and an aluminum oxide layer. It should be understood that the second passivation layer 8 may also be another type of passivation layer, which is not limited herein.

The first electrode 2 penetrates through the second passivation layer 8 to be electrically connected to the first doped conductive layer 6. The second electrode 3 penetrates through the second passivation layer 8 to be electrically connected to the second doped conductive layer 7.

It should be noted that as shown in FIG. 1 and FIG. 2, exemplarily, the P-type conductive section 121 or the N-type conductive section 122 may be formed at a side of the second surface 12 of the silicon substrate 1 away from the first surface 11, or exemplarily, the P-type conductive section 121 or the N-type conductive section 122 may be formed at a side of the second surface 12 of the silicon substrate 1 close to the first surface 11, namely, the P-type conductive section 121 or the N-type conductive section 122 may formed inside the silicon substrate 1. It should be understood that the P-type conductive section 121 or the N-type conductive section 122 may also be partially formed at the side of the second surface 12 away from the first surface 11 and partially formed at the side of the second surface 12 close to the first surface 11, which may be specifically set according to actual needs and is not limited herein.

Additionally, as shown in FIG. 2, the back contact solar cell 100 may also include an anti-reflection layer 9. The anti-reflection layer 9 may be disposed between the first passivation layer 5 and the protective layer 4.

The anti-reflection layer 9 may reduce or eliminate the reflection of light on the surface of the back contact solar cell 100 and increase the light transmittance, thereby further improving the photoelectric conversion efficiency of the back contact solar cell 100. The anti-reflection layer 9 may be a silicon nitride layer, which can further reduce the manufacturing difficulty and improve the manufacturing efficiency of the back contact solar cell 100. It should be understood that the anti-reflection layer 9 may alternatively be a silicon oxynitride layer, or a single-layer or laminated structure composed of silicon nitride and silicon oxynitride, or other anti-reflection film structure, which is not limited herein.

In a specific embodiment, as shown in FIG. 2, the back contact solar cell 100 may further include a first tunneling dielectric layer 10*a* and a second tunneling dielectric layer 10*b*. The first tunneling dielectric layer 10*a* is disposed between the first doped conductive layer 6 and the silicon substrate 1. The second tunneling dielectric layer 10*b* is disposed between the second doped conductive layer 7 and the silicon substrate 1.

As shown in FIG. 2, through the chemical passivation, the first tunneling dielectric layer 10*a* and the second tunneling dielectric layer 10*b* can reduce the state density at the interface between the silicon substrate 1 and the first doped conductive layer 6 and at the interface between the silicon substrate 1 and the second doped conductive layer 7, reduce the recombination of the minority carriers with holes, and improve the passivation effect on the surface of the silicon substrate 1. The first tunneling dielectric layer 10*a* and the second tunneling dielectric layer 10*b* can also allow majority carriers to tunnel into the first doped conductive layer 6 and the second doped conductive layer 7, thereby enabling the transverse transport of the majority carriers in the first doped conductive layer 6 and the second doped conductive layer 7, which facilitates the carrier collection by the first electrode 2 and the second electrode 3 and facilitates the improvement of the open-circuit voltage and short-circuit current of the back contact solar cell 100. Additionally, the first tunneling dielectric layer 10*a* and the second tunneling dielectric layer 10*b* may also form passivated contact structures with the first doped conductive layer 6 and the second doped conductive layer 7, respectively, thereby achieving excellent interface passivation and selective carrier collection, and improving the photoelectric conversion efficiency of the back contact solar cell 100.

A material of the first tunneling dielectric layer 10*a* or the second tunneling dielectric layer 10*b* may include, but is not limited to, a dielectric material having a tunneling effect, such as silicon oxide, silicon nitride, silicon oxynitride, molybdenum oxide, hafnium oxide, silicon carbide, magnesium fluoride, nanocrystalline silicon, intrinsic amorphous silicon, intrinsic polycrystalline silicon, or any combination thereof. The first tunneling dielectric layer 10*a* or the second tunneling dielectric layer 10*b* may be a single-layer or a laminated structure made of one or more of the above dielectric materials. In other embodiments, the first tunneling dielectric layer 10*a* or the second tunneling dielectric layer 10*b* may also be an oxygen-containing silicon nitride layer, an oxygen-containing silicon carbide layer, and the like, which is not limited herein. In some embodiments, the tunneling layer may be formed at a side of the second surface 12 of the silicon substrate 1 using methods such as an ozone oxidation method, a high-temperature thermal oxidation method, a nitric acid oxidation method, a chemical vapor deposition method, and a low-pressure chemical vapor deposition method.

Figure 3:
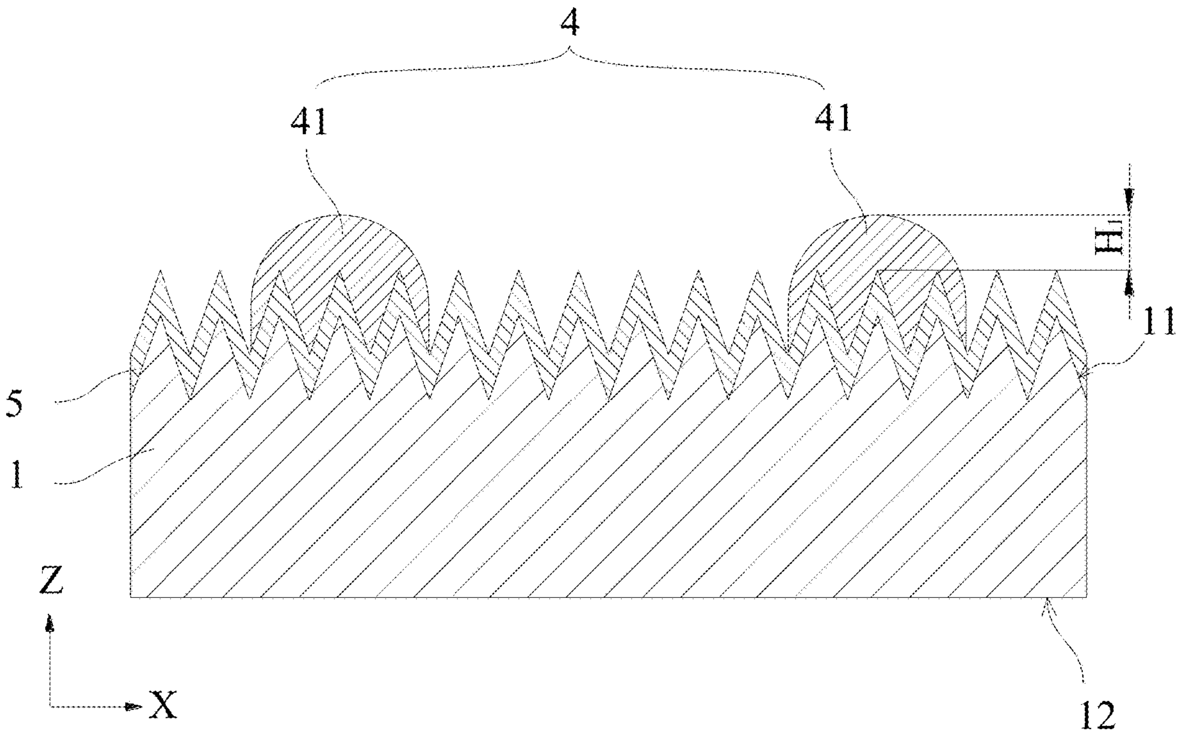
FIG. 3 is a partial schematic view of a back contact solar cell according to the present disclosure.

In a specific embodiment, as shown in FIG. 3, the protective layer 4*a* has a thickness of $H_1$, where 5 μm≤$H_1$≤60 μm. For example, the thickness $H_1$ of the protective layer 4 may be 5 μm, 10 μm, 15 μm, 20 μm, 25 μm, 30 μm, 35 μm, 40 μm, 45 μm, 50 μm, 55 μm, 60 μm, etc. It should be understood that the thickness $H_1$ of the protective layer 4 may also be other values within the above range, and may be specifically designed according to actual needs, which is not limited herein.

In this embodiment, as shown in FIG. 1 to FIG. 3, if the thickness $H_1$ of the protective layer 4 is too large, for example, $H_1$>60 μm, the overall thickness of the back contact solar cell 100 would be increased, and the manufacturing cost of the back contact solar cell 100 wound be raised. Additionally, during assembling the photovoltaic module, the too large thickness $H_1$ of the protective layer 4 tends to reduce the fit of the back contact solar cell 100 with other components, increase the difficulty of providing a film structure such as an encapsulation layer on the surface of the back contact solar cell 100, and increase the difficulty of assembling the photovoltaic module. If the thickness $H_1$ of the protective layer 4 is too small, for example, $H_1$<5 μm, the protective and isolation effect of the protective layer 4 would be inadequate, resulting in a risk of scratching or damaging the surface of the first passivation layer 5 when multiple back contact solar cells 100 are stacked with each other.

Therefore, when the thickness $H_1$ of the protective layer 4 satisfies 5 μm≤$H_1$≤60 μm, the thickness of the protective layer 4 is appropriate to provide a high protective and isolation effect and prevent the surface of the first passivation layer 5 from being scratched and damaged, with a low manufacturing cost and an easy manufacturing and forming process, which is conductive to the batch production of the back contact solar cell 100 and the assembly and formation of the photovoltaic module.

Further, as shown in FIG. 1 and FIG. 2, a maximum thickness $H_2$ between a surface of the second passivation layer 8 facing away from the silicon substrate 1 and a surface of the first passivation layer 5 or the anti-reflection layer 9 facing away from the silicon substrate 1 in the back contact solar cell 100, namely, the sum of maximum thicknesses of all films in the back contact solar cell 100 in addition to the protective layer 4, the first electrode 2, and the second electrode 3, may range from 90 μm to 210 μm to improve the design flexibility of the back contact solar cell 100, which may be specifically set according to actual needs and is not limited herein.

Figure 4:
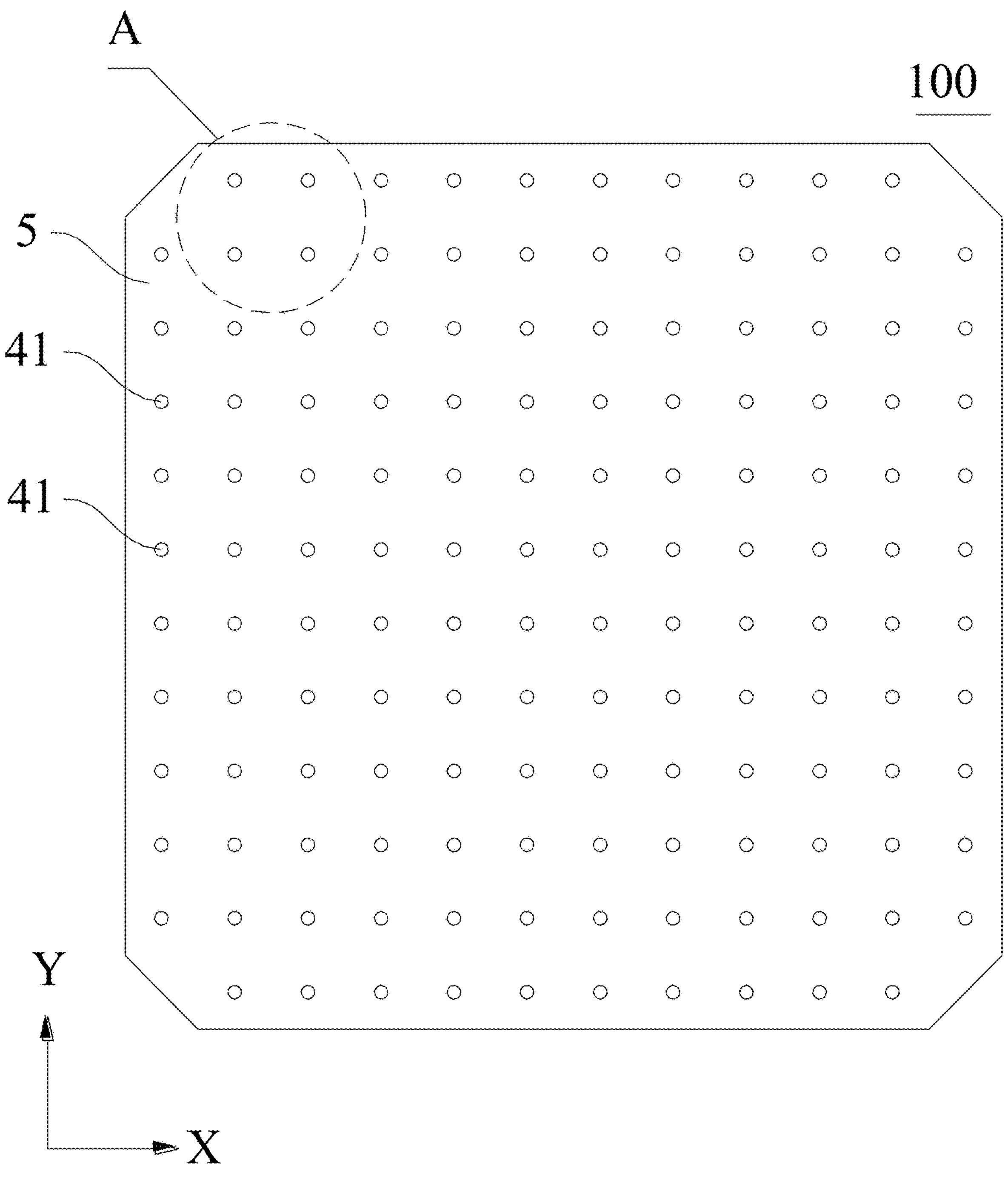
FIG. 4 is a top view of a back contact solar cell in a specific embodiment of the present disclosure.

In a specific embodiment, as shown in FIG. 4, in the thickness direction Z of the back contact solar cell 100, a projected area of the protective layer 4 is 2% to 3% of a projected area of the silicon substrate 1. For example, the projected area of the protective layer 4 may be 2%, 2.1%, 2.2%, 2.3%, 2.4%, 2.5%, 2.6%, 2.7%, 2.8%, 2.9%, 3%, etc. of the projected area of the silicon substrate 1, and may also be other values within the above range, which may be specifically set according to actual needs and is not limited herein.

As shown in FIG. 1 and FIG. 4, if the projected area of the protective layer 4 is too large, for example, greater than 3% of the projected area of the silicon substrate 1, the absorption of light by the silicon substrate 1 may be affected, resulting in a significant optical loss, a high current loss, and a potential decrease in the photoelectric conversion efficiency of the back contact solar cell 100. Exemplarily, when the projected area of the protective layer 4 is greater than 5% of the projected area of the silicon substrate 1, the current loss is greater than 50 mA, leading to a decrease in the photoelectric conversion efficiency of the back contact solar cell 100.

If the projected area of the protective layer 4 is too small, for example, less than 2% of the projected area of the silicon substrate 1, a larger area of the first passivation layer 5 is exposed, so that when two adjacent back contact solar cells 100 are stacked unevenly or misaligned from each other, there is a risk of scratching or damaging the surface of the first passivation layer 5, and the protective layer 4 has a poor protective and isolation effect.

In the embodiment as shown in FIG. 4, when the projected area of the protective layer 4 is 2% to 3% of the projected area of the silicon substrate 1, the influence of the protective layer 4 on the light absorption of the silicon substrate 1 is small, resulting in a low optical loss and a low current loss. In this embodiment, when the projected area of the protective layer 4 is 2% to 3% of the projected area of the silicon substrate 1, the current loss is less than 30 mA. Additionally, the protective layer 4 has a good protective and isolation effect, and can prevent the first passivation layer 5 and other films on the first surface 11 of the silicon substrate 1 from being scratched and damaged, thereby ensuring that the back contact solar cell 100 has a high photoelectric conversion efficiency.

In a specific embodiment, the protective layer 4 is a transparent protective layer, allowing light to pass through the protective layer 4 and reach the first surface 11, which can further reduce the optical loss and improve the photoelectric conversion efficiency of the back contact solar cell 100.

In a specific embodiment, a material of the protective layer 4 is any one of or a combination of two or more of acrylic resin, epoxy resin, polyurethane, and silicone.

The material such as the acrylic resin, the epoxy resin, the polyurethane, and the silicone has a high transparency, a good light and color retention, a water and chemical resistance, and a low cost, and is unlikely to cause damage to the first passivation layer 5 and other films on the first surface 11 or to the back contact solar cell 100 in contact with the material, thereby further reducing the optical loss and saving the cost.

In a specific embodiment, as shown in FIG. 4 to FIG. 7, the protective layer 4 includes a plurality of support members 41 spaced apart from each other and disposed on the side of the first passivation layer 5 facing away from the silicon substrate 1.

Figure 6:
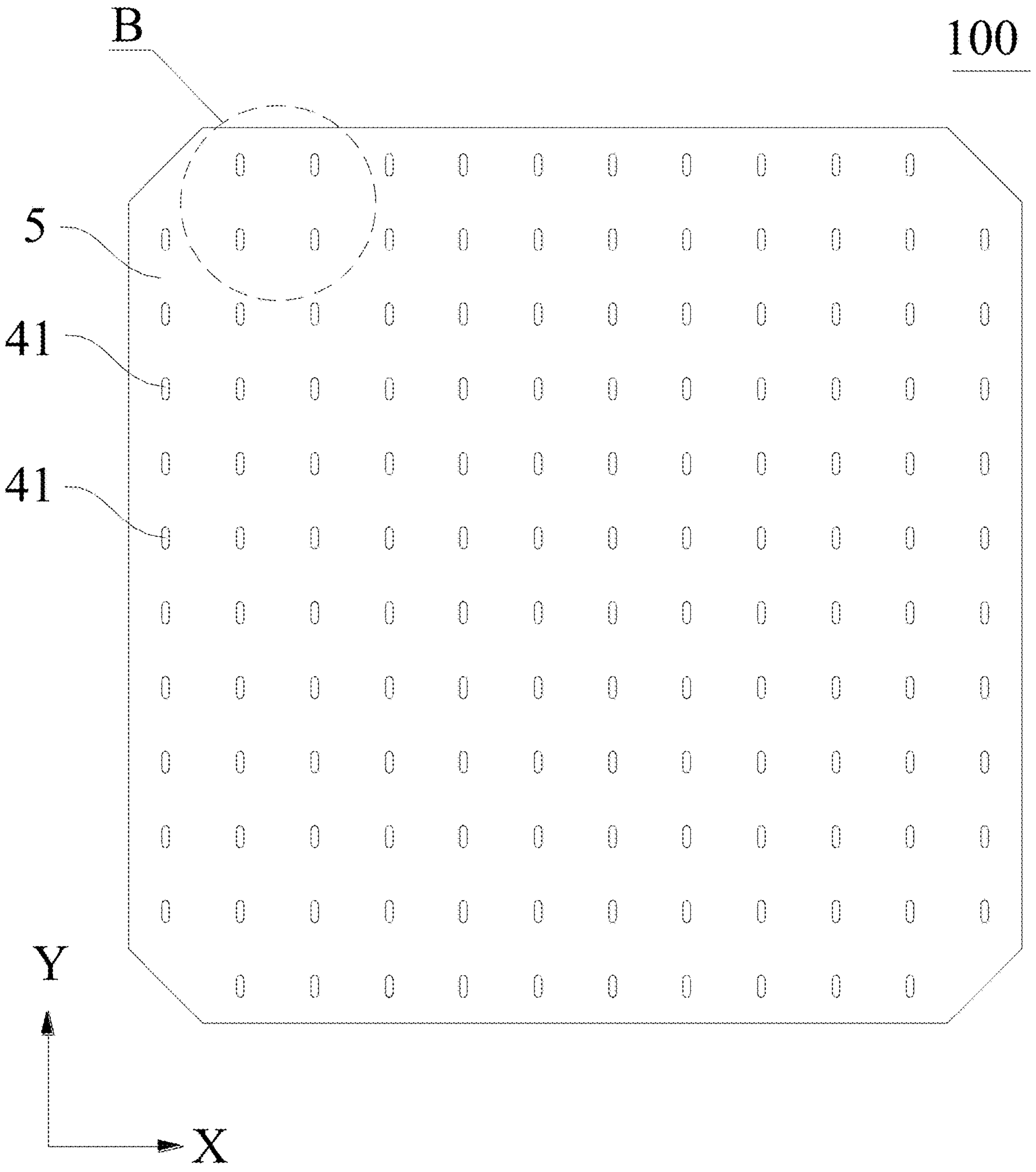
FIG. 6 is a top view of a back contact solar cell in another specific embodiment of the present disclosure.

In this embodiment, as shown in FIG. 4 and FIG. 6, the support members 41 may keep a distance between the first passivation layer 5 disposed on the first surface 11 and other stacked back contact solar cells 100 or other objects, thereby preventing the surface of the first passivation layer 5 from coming into contact with other objects and being scratched and damaged. Moreover, the plurality of support members 41 collectively form the protective layer, which enables the protective layer 4 to be uniformly disposed on the side of the first passivation layer 5 facing away from the silicon substrate 1, so that the protective layer 4 can provide a uniform supporting force to objects stacked on the surface thereof, thereby reducing the likelihood of their relative slippage, ensuring the stability of the stack of a plurality of back contact solar cells 100, and further reducing the risk of scratching or damaging the first passivation layer 5 and other films on the first surface 11. Additionally, the formation of the protective layer 4 by the plurality of support members 41 can further reduce the projected area of the protective layer 4 on the silicon substrate 1, thereby further reducing the optical loss of the back contact solar cell 100 while ensuring the high protective and isolation effect of the protective layer 4.

Figure 5:
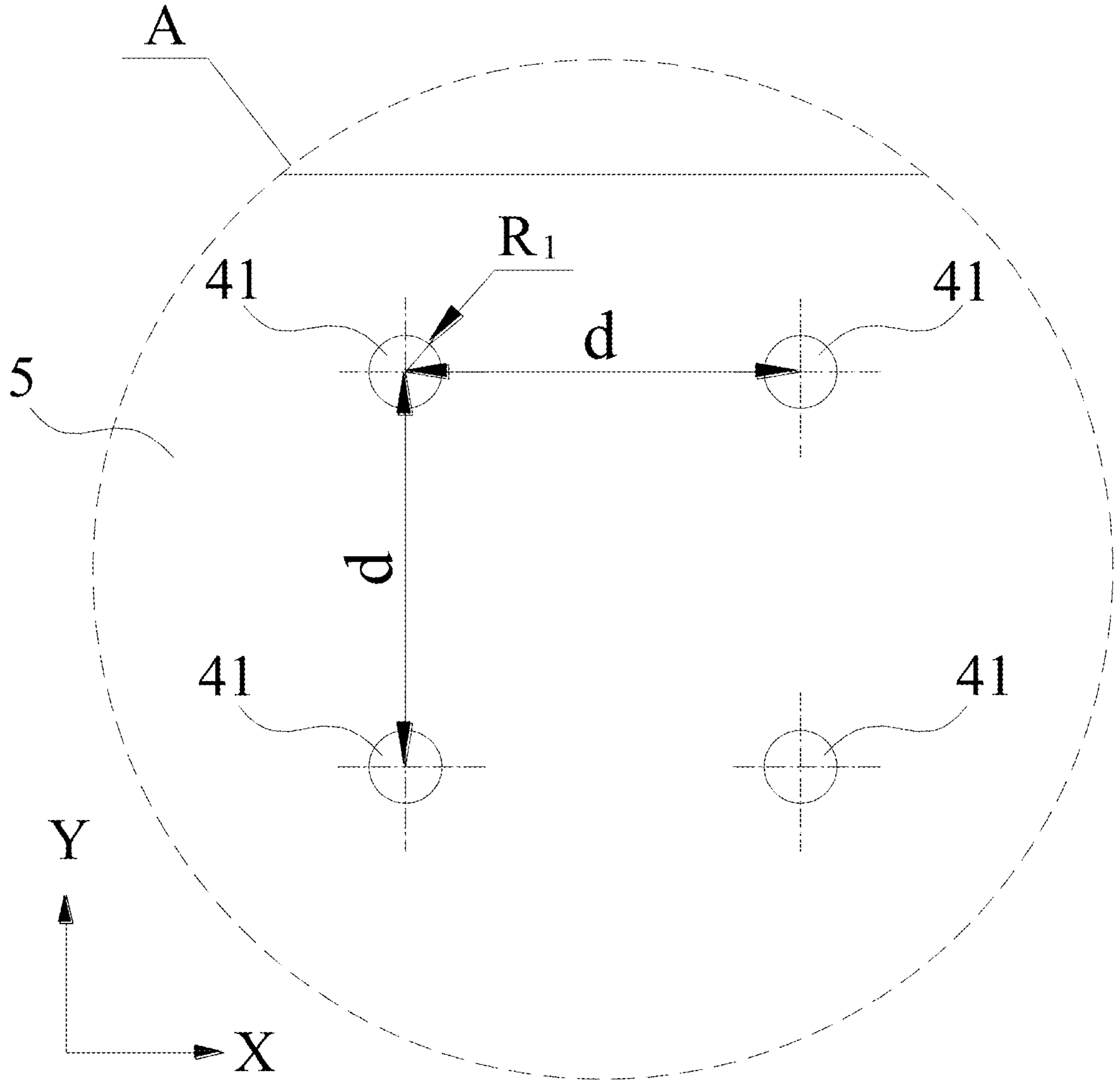
FIG. 5 is a partial enlarged view of a position A in FIG. 4.
Figure 7:
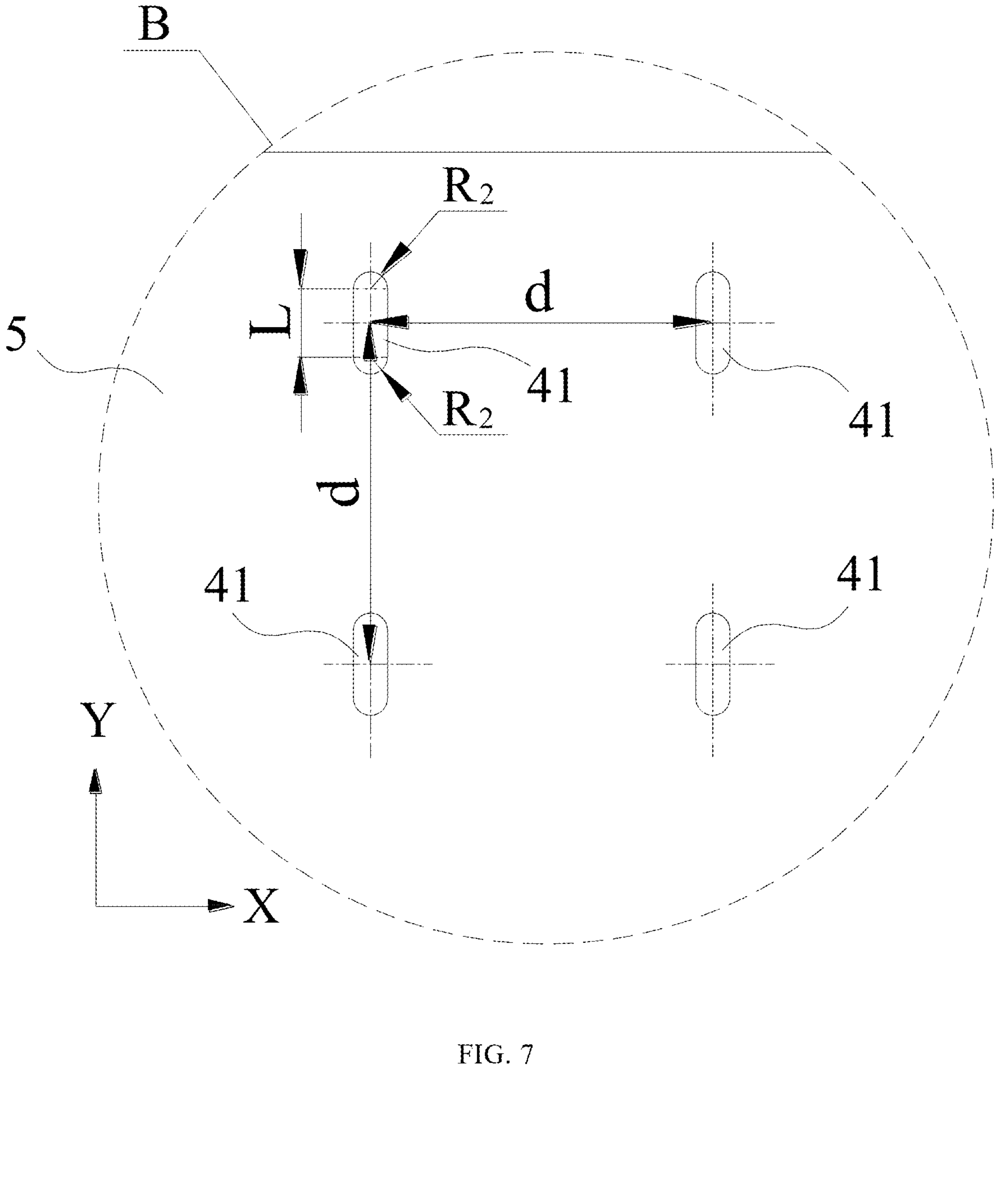
FIG. 7 is a partial enlarged view of a position B in FIG. 6.

In a specific embodiment, as shown in FIG. 5 and FIG. 7, a distance between geometric centers of any two adjacent support members 41 is d, where $0<d\leq 20$ mm. For example, the distance d between the geometric centers of any two adjacent support members 41 may be 1 mm, 2 mm, 3 mm, 4 mm, 5 mm, 6 mm, 7 mm, 8 mm, 9 mm, 10 mm, 11 mm, 12 mm, 15 mm, 18 mm, 20 mm, etc. It should be understood that the distance d between the geometric centers of any two adjacent support members 41 may also be other values within the above range, which may be specifically set according to actual needs and is not limited herein.

As shown in FIG. 4 to FIG. 7, if the distance d between the geometric centers of any two adjacent support members 41 is too large, for example, $d>20$ mm, then any two adjacent support members 41 would be too far apart, increasing the likelihood that the back contact solar cells 100 or other objects stacked on the protective layer 4 may come into contact with and scratch or damage the first passivation layer 5 and other film structures disposed on the first surface 11 through the gap between the two adjacent support members 41.

In this embodiment, as shown in FIG. 4 to FIG. 7, when the distance d between the geometric centers of two adjacent support members 41 satisfies $0<d\leq 20$ mm, then any two adjacent support members 41 would be appropriately apart such that it is difficult for the back contact solar cells 100 or other objects stacked on the protective layer 4 to extend into the gap between two adjacent support members 41, thereby further improving the protective and isolation effect of the protective layer 4, preventing the contact between the back contact solar cells 100 or other objects with the first passivation layer 5 and other film structures on the first surface 11, and reducing the risk of scratching or damaging the first passivation layer 5 and other film structures on the first surface 11.

In a specific embodiment, a cross-sectional shape of the support member 41, perpendicular to the thickness direction Z of the back contact solar cell 100, is a circular shape, a semicircular shape, an annular shape, a rectangular shape, a triangular shape, a rhombic shape, a W shape, a V shape, or any combination thereof. Such a structure is simple, facilitating the manufacture of the protective layer 4, and improving the design flexibility of the back contact solar cell 100.

It should be understood that the cross-sectional shape of the support member 41 may also be a pentagonal shape, a hexagonal shape, or an irregular shape, which may be specifically set according to actual needs and is not limited herein.

In a specific embodiment, as shown in FIG. 4 and FIG. 5, the cross-sectional shape of the support member 41 perpendicular to the thickness direction Z of the back contact solar cell 100, i.e., in a plane of the first direction X and the second direction Y, is a circular shape. Such a structure is simple and easy to manufacture, further reducing the manufacture difficulty and saving the cost of the protective layer 4.

As shown in FIG. 4 and FIG. 5, a radius of the circular shape is $R_1$, where $0<R_1\leq 4$ mm. For example, $R_1$ may be 0.5 mm, 0.75 mm, 0.8 mm, 1 mm, 1.2 mm, 1.5 mm, 1.6 mm, 1.8 mm, 2 mm, 2.5 mm, 3 mm, 3.5 mm, 4 mm, etc. It should be understood that the radius $R_1$ of the circular shape may also be other values within the above range, which may be specifically set according to actual needs and is not limited herein.

When the cross-sectional shape of the support member 41 is the circular shape, the projected area S of the protective layer 4 may be calculated through the formula $$S = \pi R_1^2 * \left(\frac{M}{d^2}\right).$$

In the formula, S denotes the projected area of the protective layer 4 in $mm^2$; $R_1$ denotes the cross-sectional radius of each support member 41 in mm; M denotes the projected area of the silicon substrate 1 in the thickness direction Z in $mm^2$; and d denotes the distance between the geometric centers of two adjacent support members 41 in mm.

According to the formula $$S = \pi R_1^2 * \left(\frac{M}{d^2}\right),$$

it can be seen that the projected area S of the protective layer 4 is directly proportional to the cross-sectional radius $R_1$ of the support member 41. Therefore, if $R_1$ is too large, the projected area of single support member 41 is relatively large, so that the projected area S of the protective layer 4 tends to be too large, which is likely to increase the optical loss of the back contact solar cell 100, and consequently reduce the photoelectric conversion efficiency of the back contact solar cell 100.

Therefore, when the cross-sectional shape of the support member 41 is the circular shape and the radius $R_1$ of the circular shape satisfies $0<R_1\leq 4$ mm, the projected area of single support member 41 will not be too large, while the support member 41 can have a certain supporting force, allowing the protective layer 4 to have a good protective and isolation effect. Additionally, such structure configuration can avoid too large projected area S of the protective layer 4, thereby reducing the optical loss caused by the protective layer 4 and ensuring that the back contact solar cell 100 can have high photoelectric conversion efficiency.

In another specific embodiment, as shown in FIG. 6 and FIG. 7, the cross-sectional shape of the support member 41 perpendicular to the thickness direction Z of the back contact solar cell 100, i.e., in a plane of the first direction X and the second direction Y, is a strip shape formed by combining a semicircular shape with a rectangular shape. The support member 41 of such structure has the advantages of simple structure, easy manufacture, and improved support effect.

Specifically, the support member 41 is in a strip cross-sectional shape formed by a rectangular shape with two semicircular shapes disposed at two opposite ends of the rectangular shape. Exemplarily, as shown in FIG. 7, the two semicircular shapes are disposed on two opposite sides of the rectangular shape in the second direction Y, and a width size of the rectangular shape in the first direction X is the same as a diameter of the semicircular shapes.

As shown in FIG. 6 and FIG. 7, a radius of each semicircular shape in the cross-sectional shape of the support member 41 is $R_2$, where $0<R_2\leq 2$ mm. For example, $R_2$ may be 0.5 mm, 0.75 mm, 0.8 mm, 1 mm, 1.2 mm, 1.5 mm, 1.6 mm, 1.8 mm, 2 mm, etc. It should be understood that the radius $R_2$ of each semicircular shape may also be other values within the above range, which may be specifically set according to actual needs and is not limited herein.

A length of the rectangular shape in the cross-sectional shape of the support member 41 is L, where $1\leq L/R_2\leq 5$. For example, $L/R_2$ may be 1, 2, 3, 4, 5, etc. It should be understood that $L/R_2$ may also be other values within the above range, which is not limited herein.

When the cross-sectional shape of the support member 41 is the strip shape, the projected area S of the protective layer 4 may be calculated through the formula $$S = (\pi R_2^2 + 2R_2 * L) * \left(\frac{M}{d^2}\right).$$

In the formula, S denotes the projected area of the protective layer 4 in $mm^2$; $R_2$ denotes the radius of each semicircular shape in the cross-sectional shape of the support member 41 in mm; L denotes the length L of the rectangular shape in the cross-sectional shape of the support member 41 in mm; M denotes the projected area of the silicon substrate 1 in the thickness direction Z in $mm^2$; and d denotes the distance between the geometric centers of two adjacent support members 41 in mm.

According to the formula $$S = (\pi R_2^2 + 2R_2 * L) * \left(\frac{M}{d^2}\right),$$

it can be seen that the projected area S of the protective layer 4 is directly proportional to the radius $R_2$ of each semicircular shape and the length L of the rectangular shape in the cross-sectional shape of the support member 41. Therefore, if $R_2$ and L are too large, the projected area of single support member 41 would be relatively large, so that the projected area S of the protective layer 4 tends to be too large, which is likely to increase the optical loss of the back contact solar cell 100, and consequently reduce the photoelectric conversion efficiency of the back contact solar cell 100.

Therefore, when the cross-sectional shape of the support member 41 is the strip shape formed by combining the semicircular shapes and the rectangular shape, the radius $R_2$ of each semicircular shape in the cross-sectional shape satisfies $0<R_2\leq 2$ mm, and the length L of the rectangular shape in the cross-sectional shape satisfies $1\leq L/R_2\leq 5$, the projected area of single support member 41 will not be too large, while the support member 41 can have a larger supporting force, allowing the protective layer 4 to have a good protective and isolation effect. Additionally, such structure configuration can avoid too large projected area S of the protective layer 4, thereby reducing the optical loss caused by the protective layer 4 and ensuring that the back contact solar cell 100 can have high photoelectric conversion efficiency.

Figure 8:
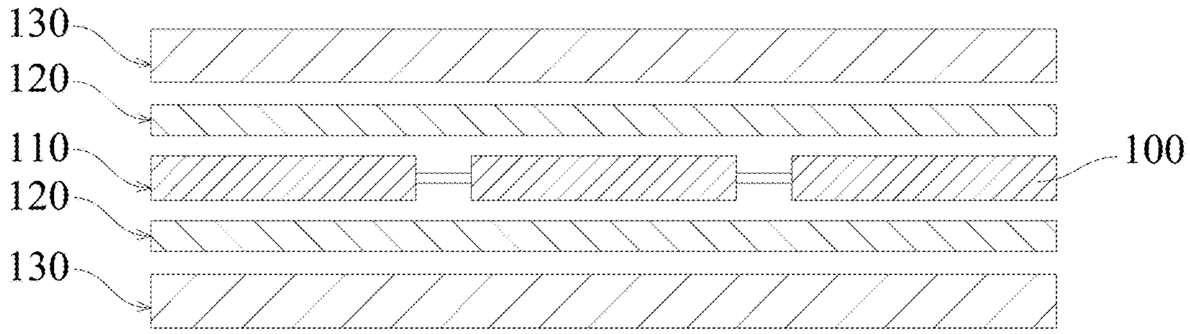
FIG. 8 is a schematic structural view of a photovoltaic module according to the present disclosure.

In a second aspect, the present disclosure provides a photovoltaic module. As shown in FIG. 8, the photovoltaic module includes at least one cell string 110, at least one encapsulation layer 120, and at least one cover plate 130. The cell string 110 is formed by a plurality of back contact solar cells 100 that are provided according to any one of the embodiments described above and connected to each other. The at least one encapsulation layer 120 is configured to cover the surfaces of the protective layers 4 of the cell string 110. The cover plate 130 is configured to cover a surface of the encapsulation layer 120 that is away from the cell string 110. Since the back contact solar cell 100 has the above technical effects, the photovoltaic module that includes the solar cells 100 should also have the above technical effects, and further elaboration is unnecessary herein.

As shown in FIG. 8, the back contact solar cells 100 may be electrically connected in whole or in pieces to form a plurality of cell strings 110. The plurality of cell strings 110 may be electrically connected in series and/or in parallel. Specifically, the plurality of cell strings 110 may be electrically connected through conductive tapes.

The front surfaces and the back surfaces of the back contact solar cells are covered by the at least one encapsulation layer 120. Specifically, the encapsulation layer 120 may be an organic encapsulation film such as an ethylene-vinyl acetate (EVA) film, a polyethylene octene elastomer (POE) film, a polyethylene terephthalate (PET) film, or a polyvinyl butyral (PVB) film.

The cover plate 130 may be a glass cover plate, a plastic cover plate, or any other cover plate 130 with a light transmitting function. Specifically, a surface of the cover plate 130 facing towards the encapsulation layer 120 may be a concave-convex surface to increase the utilization rate of incident light.

In this specification, similar or identical parts among various embodiments can be made reference to each other.

The above descriptions are merely specific implementations of the embodiments of the present disclosure, but the scope of protection of the embodiments of the present disclosure is not limited thereto; and any modification or substitution within the technical scope disclosed by the embodiments of the present disclosure shall fall within the scope of protection of the embodiments of the present disclosure. Therefore, the scope of protection of the embodiments of the present disclosure shall take the scope of protection of the claims as final.

What is claimed is:

1. A back contact solar cell, comprising:

a silicon substrate having a first surface and a second surface opposite to each other, a P-type conductive section and an N-type conductive section spaced apart from each other being provided at a side of the second surface of the silicon substrate;

a first passivation layer disposed on the first surface of the silicon substrate;

a protective layer disposed on a side of the first passivation layer facing away from the silicon substrate;

a first electrode electrically connected to the P-type conductive section; and a second electrode electrically connected to the N-type conductive section;

wherein the protective layer comprises a plurality of support members spaced apart from each other and disposed on the side of the first passivation layer facing away from the silicon substrate; and a distance between geometric centers of any two adjacent support members is greater than 0 mm and smaller than or equal to 20 mm.

2. The back contact solar cell according to claim 1, wherein in a thickness direction of the back contact solar cell, a projected area of the protective layer is 2% to 3% of a projected area of the silicon substrate.

3. The back contact solar cell according to claim 1, wherein the protective layer has a thickness of $H_1$, where 5 $\mu m\leq H_1\leq 60$ $\mu m$.

4. The back contact solar cell according to claim 1, wherein a cross-sectional shape of the support members, perpendicular to a thickness direction of the back contact solar cell, is a circular shape, a semicircular shape, an annular shape, a rectangular shape, a triangular shape, a rhombic shape, a W shape, a V shape, or any combination thereof.

5. The back contact solar cell according to claim 1, wherein a cross-sectional shape of the support members, perpendicular to a thickness direction of the back contact solar cell, is a circular shape having a radius of $R_1$, where $0<R_1\leq 4$ mm.

6. The back contact solar cell according to claim 1, wherein a cross-sectional shape of the support members, perpendicular to a thickness direction of the back contact solar cell, is a strip shape formed by combing a semicircular shape and a rectangular shape;

the semicircular shape has a radius of $R_2$, where $0<R_2\leq 2$ mm; and the rectangular shape has a length of L, where $1\leq L/R_2\leq 5$.

7. The back contact solar cell according to claim 6, wherein the strip shape is formed by one rectangular shape with two semicircular shapes disposed at two opposite ends of the one rectangular shape in a length direction of the one rectangular shape.

8. The back contact solar cell according to claim 7, wherein the rectangular shape has a width the same as a diameter of the two semicircular shapes.

9. The back contact solar cell according to claim 1, wherein the protective layer is a transparent protective layer.

10. The back contact solar cell according to claim 1, wherein a material of the protective layer is acrylic resin, epoxy resin, polyurethane, silicone, or any combination thereof.

11. The back contact solar cell according to claim 1, further comprising:

a first doped conductive layer disposed in the P-type conductive section at the second surface of the silicon substrate;

a second doped conductive layer disposed in the N-type conductive section at the second surface of the silicon substrate; and a second passivation layer disposed on a side of the first doped conductive layer and a side of the second doped conductive layer that face away from the silicon substrate, and disposed on at least a portion of the second surface.

12. The back contact solar cell according to claim 11, wherein the first doped conductive layer forms a PN junction structure with the silicon substrate.

13. The back contact solar cell according to claim 11, wherein each of the second doped conductive layer and the silicon substrate contains a doping element, and a concentration gradient of the doping element is formed between the second doped conductive layer and the silicon substrate.

14. The back contact solar cell according to claim 11, wherein the first electrode penetrates through the second passivation layer to be electrically connected to the first doped conductive layer, and the second electrode penetrates through the second passivation layer to be electrically connected to the second doped conductive layer.

15. The back contact solar cell according to claim 11, further comprising:

a first tunneling dielectric layer disposed between the first doped conductive layer and the silicon substrate; and a second tunneling dielectric layer disposed between the second doped conductive layer and the silicon substrate.

16. The back contact solar cell according to claim 11, further comprising an anti-reflection layer disposed between the first passivation layer and the protective layer.

17. The back contact solar cell according to claim 16, wherein a thickness between a surface of the second passivation layer facing away from the silicon substrate and a surface of the first passivation layer or the anti-reflection layer facing away from the silicon substrate is 90 μm to 210 μm.

18. A photovoltaic module, comprising:

a cell string formed by a plurality of back contact solar cells connected to each other, wherein each of the plurality of back contact solar cells is the back contact solar cell of claim 1;

an encapsulation layer configured to cover a surface of the protective layer of each of the plurality of back contact solar cells of the cell string; and a cover plate configured to cover a surface of the encapsulation layer away from the cell string.

19. A back contact solar cell, comprising:

a silicon substrate having a first surface and a second surface opposite to each other, a P-type conductive section and an N-type conductive section spaced apart from each other being provided at a side of the second surface of the silicon substrate;

a first passivation layer disposed on the first surface of the silicon substrate;

a protective layer disposed on a side of the first passivation layer facing away from the silicon substrate;

a first electrode electrically connected to the P-type conductive section; and a second electrode electrically connected to the N-type conductive section;

wherein the protective layer comprises a plurality of support members spaced apart from each other and disposed on the side of the first passivation layer facing away from the silicon substrate;

wherein in a thickness direction of the back contact solar cell, a projected area of the protective layer is 2% to 3% of a projected area of the silicon substrate.

* * * * *